(12) United States Patent
Plank et al.

(10) Patent No.: US 11,711,621 B2
(45) Date of Patent: Jul. 25, 2023

(54) ELECTRONIC DEVICE AND METHOD FOR AN ELECTRONIC DEVICE

(71) Applicant: Infineon Technologies AG, Neubiberg (DE)

(72) Inventors: Hannes Plank, Graz (AT); Markus Dielacher, Graz (AT); Martin Flatscher, Graz (AT); Heinrich Guenther Heiss, Munich (DE); Robert Lobnik, Bad Eisenkappel (AT); Armin Josef Schoenlieb, Seiersberg-Pirka (AT)

(73) Assignee: Infineon Technologies AG, Neubiberg (DE)

( * ) Notice: Subject to any disclaimer, the term of this patent is extended or adjusted under 35 U.S.C. 154(b) by 27 days.

(21) Appl. No.: 17/524,113

(22) Filed: Nov. 11, 2021

(65) Prior Publication Data
US 2022/0150395 A1 May 12, 2022

(30) Foreign Application Priority Data
Nov. 12, 2020 (EP) .................................... 20207130

(51) Int. Cl.
*H04N 23/74* (2023.01)
*H04N 23/56* (2023.01)
(Continued)

(52) U.S. Cl.
CPC ............ *H04N 23/74* (2023.01); *H04N 23/56* (2023.01); *H04N 23/57* (2023.01); *G01S 7/4813* (2013.01); *G01S 17/08* (2013.01)

(58) Field of Classification Search
CPC ........ H04N 23/74; H04N 23/56; H04N 23/57; G01S 7/4813; G01S 17/08; H01M 1/22;
(Continued)

(56) References Cited

U.S. PATENT DOCUMENTS

2008/0175603 A1* 7/2008 Son .................. H04B 10/672
398/212
2010/0060569 A1* 3/2010 Shamilian ............ G08C 23/04
345/156
(Continued)

FOREIGN PATENT DOCUMENTS

CN 109141485 A 1/2019
CN 110491909 A 11/2019
(Continued)

*Primary Examiner* — Brent D Castiaux
(74) *Attorney, Agent, or Firm* — Murphy, Bilak & Homiller, PLLC

(57) ABSTRACT

An electronic device is provided. The electronic device includes: a display device including a plurality of light-emitting elements for displaying an optical image on a front side of the display device; an illumination element integrated into the display device and configured to emit light for illuminating a scene in front of the front side of the display device; an optical sensor configured to sense reflections of the light from the scene; an optical transmitter configured to transmit an optical control signal encoded with control information for controlling light emission by the illumination element; and an optical receiver integrated into the display device and configured to receive the optical control signal and generate an electrical control signal based on the optical control signal. The electronic device further includes a driver circuit integrated into the display device and configured to drive the illumination element based on the electrical control signal.

15 Claims, 2 Drawing Sheets

(51) Int. Cl.
*H04N 23/57* (2023.01)
*G01S 17/08* (2006.01)
*G01S 7/481* (2006.01)

(58) Field of Classification Search
CPC ... H01M 1/72454; H10K 59/00; Y02D 10/00; G06F 1/1686; G06F 1/3215; G06F 1/324; G06F 1/3287; G06F 1/3296; G06F 1/1684; G06F 1/1626; G06F 1/3265; G06F 3/0412; G06F 3/0421; H01L 25/167; G09G 3/32; G09G 3/3208; G09G 3/3406; G09G 3/36
See application file for complete search history.

(56) References Cited

U.S. PATENT DOCUMENTS

| | | | |
|---|---|---|---|
| 2012/0146953 A1* | 6/2012 | Yi | G06F 3/0412 |
| | | | 345/175 |
| 2013/0135328 A1 | 5/2013 | Rappoport et al. | |
| 2015/0201130 A1 | 7/2015 | Cho et al. | |
| 2019/0006438 A1 | 1/2019 | Wu et al. | |
| 2019/0280058 A1* | 9/2019 | Li | G06F 3/041 |
| 2020/0312925 A1 | 10/2020 | Xia et al. | |

FOREIGN PATENT DOCUMENTS

| | | |
|---|---|---|
| CN | 107767835 B | 4/2020 |
| EP | 3537255 A1 | 9/2019 |
| JP | 2008304523 A | 12/2008 |

\* cited by examiner

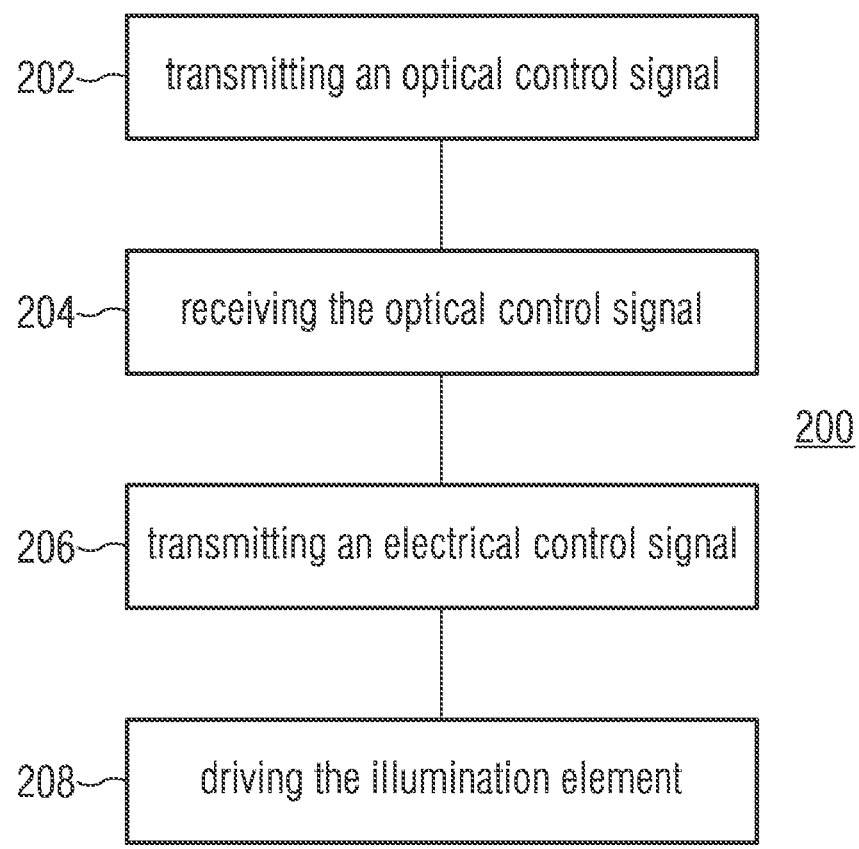

ELECTRONIC DEVICE AND METHOD FOR AN ELECTRONIC DEVICE

TECHNICAL FIELD

The present disclosure relates to an electronic device and a method for an electronic device.

BACKGROUND

Displays of devices like smartphones tend to occupy the complete front side of the device such that optical sensors are located under the display. Optical sensors with active illumination units (e.g. Time-of-Flight, ToF, sensors) suffer from this trend because the light needs to pass the display twice.

Displays and optical sensors present themselves as separate components. An illumination unit in the display would need a wired connection, in order to receive an enable signal. Since ToF sensors use modulation frequencies of over 120 MHz (expected to increase), it is difficult to provide a corresponding enable signal over a wired connection. Such a connection line cannot take a direct path between sensor and illumination unit. Consequently, an electrical connection would have to be placed between the Red Green Blue (RBG) pixels of the display before arriving at the main circuit board of the device. Such configuration is not well-suited for high-frequency signals as such frequencies do not occur at displays. Consequently, there would be parasitic capacitances. Further, no electromagnetic shielding would be provided.

A direct electrical connection between the optical sensor and the illumination unit inside the display is possible in theory. This would, however, mean that the display needs to be connected (bonded) to the optical sensor module, and that the display needs to feature an electrical terminal on the rear side (all circuits of the display are usually located on the user facing front side of the display substrate).

Hence, there may be a demand for improved control of an in-display illumination element.

SUMMARY

The demand may be satisfied by the subject matter of the appended claims.

An example relates to an electronic device. The electronic device comprises a display device comprising a plurality of light-emitting elements for displaying an optical image on a front side of the display device. Further, the electronic device comprises an illumination element integrated into the display device and configured to emit light for illuminating a scene in front of the front side of the display device. The electronic device additionally comprises an optical sensor configured to sense reflections of the emitted light from the scene, and an optical transmitter configured to transmit an optical control signal encoded with control information for controlling light emission by the illumination element. Furthermore, the electronic device comprises an optical receiver integrated into the display device. The optical receiver is configured to receive the optical control signal and generate an electrical control signal based on the optical control signal. The electronic device comprises a driver circuit integrated into the display device and configured to drive the illumination element based on the electrical control signal.

Another example relates to a method for an electronic device comprising a display device, an illumination element integrated into the display device and an optical sensor. The display device comprises a plurality of light-emitting elements for displaying an optical image on a front side of the display device. The illumination element is for emitting light for illuminating a scene in front of the front side of the display device. The optical sensor is for sensing reflections of the emitted light from the scene. The method comprises transmitting, using an optical transmitter, an optical control signal encoded with control information for controlling light emission by the illumination element. Further, the method comprises receiving the optical control signal at an optical receiver integrated into the display device. The method additionally comprises generating, using the optical receiver, an electrical control signal based on the received optical control signal. The method comprises driving the illumination element based on the electrical control signal using a driver circuit integrated into the display device.

BRIEF DESCRIPTION OF THE FIGURES

Some examples of apparatuses and/or methods will be described in the following by way of example only, and with reference to the accompanying figures, in which FIG. 2 illustrates a flowchart of an example of a method for an electronic device.

DETAILED DESCRIPTION

Figure 1:
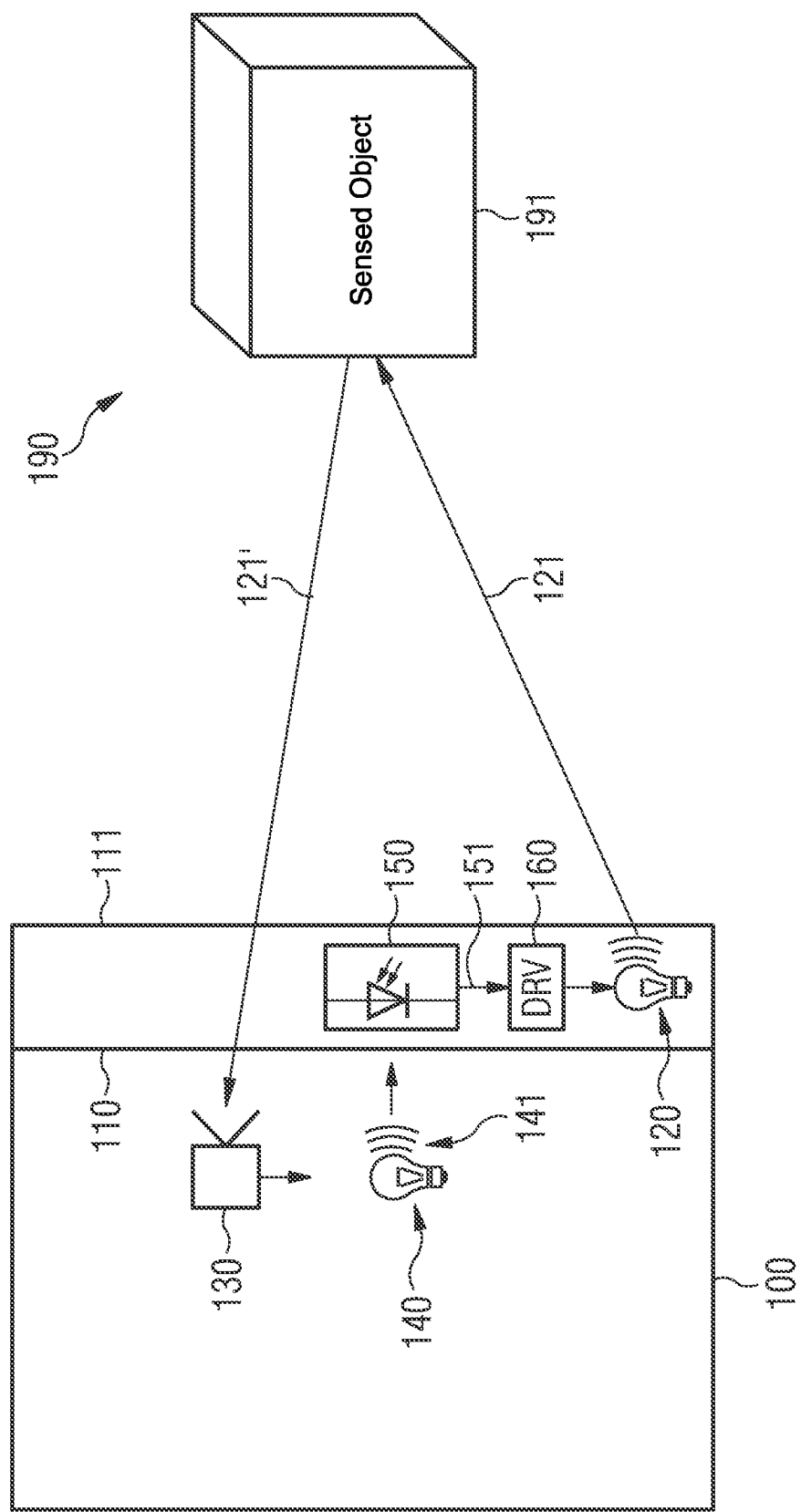
FIG. 1 illustrates an example of an electronic device.

Some examples are now described in more detail with reference to the enclosed figures. However, other possible examples are not limited to the features of these embodiments described in detail. Other examples may include modifications of the features as well as equivalents and alternatives to the features. Furthermore, the terminology used herein to describe certain examples should not be restrictive of further possible examples.

Throughout the description of the figures same or similar reference numerals refer to same or similar elements and/or features, which may be identical or implemented in a modified form while providing the same or a similar function. The thickness of lines, layers and/or areas in the figures may also be exaggerated for clarification.

When two elements A and B are combined using an "or", this is to be understood as disclosing all possible combinations, i.e. only A, only B as well as A and B, unless expressly defined otherwise in the individual case. As an alternative wording for the same combinations, "at least one of A and B" or "A and/or B" may be used. This applies equivalently to combinations of more than two elements.

If a singular form, such as "a", "an" and "the" is used and the use of only a single element is not defined as mandatory either explicitly or implicitly, further examples may also use several elements to implement the same function. If a function is described below as implemented using multiple elements, further examples may implement the same function using a single element or a single processing entity. It is further understood that the terms "include", "including", "comprise" and/or "comprising", when used, describe the presence of the specified features, integers, steps, operations, processes, elements, components and/or a group thereof, but do not exclude the presence or addition of one or more other features, integers, steps, operations, processes, elements, components and/or a group thereof.

FIG. 1 illustrates an electronic device 100 such as, e.g., a smartphone, a tablet-computer or a laptop-computer. However, it is to be noted that the electronic device 100 may be any other electronic device as well.

The electronic device 100 comprises a display device 110. The display device 110 comprises a plurality of light-emitting elements (circuitries, devices) for displaying an optical image on a front side 111 of the display device 110. The front side 111 of the display device 110 is the side of the display device 110 that can be seen by a user of the electronic device 100. For example, the plurality of light-emitting elements may be arranged in an array of pixels for displaying the optical image. The display device 110 may be formed according to a display technology. For example, the display device 110 may be a Light Emitting Diode (LED) display, an Organic LED (OLED) display, a Liquid Crystal Display (LCD) or a micro LED display. However, it is to be noted that any other display technology may be used as well for the display device 110.

The display device 110 may cover (substantially) the entire front surface of the electronic device 100 as illustrated in FIG. 1. In other examples, the display device 110 may cover only a fraction of the electronic device 100's front surface.

The electronic device 100 further comprises an illumination element (circuitry, device) 120. The illumination element 120 is integrated into the display device 110. That is, the illumination element 120 is an integral part of the display device 110. The illumination element 120 is configured to emit light 121 for illuminating a scene 190 in front of the front side 111 of the display device 110. For example, an object 191 in the scene 190 may be illuminated by the emitted light 121. In general, the light 121 emitted by the illumination element 120 may be of any desired (target) wavelength (wavelength range). For example, the illumination element 120 may be configured to emit infrared light as the light 121 (i.e. the wavelength of the light 121 is between approx. 700 nm and approx. 1 mm). The illumination element 120 may, e.g., comprise/be one or more LEDs, one or more micro LEDs and/or one or more laser diodes (e.g. one or more Vertical-Cavity Surface-Emitting Lasers, VCSELs).

Additionally, the electronic device 100 comprises an optical sensor 130. The optical sensor 130 is configured to sense (measure) reflections 121' of the emitted light 121 from the scene 190, i.e. the optical sensor 130 is configured to sense the fraction of the light 121 that is reflected back from the scene 190. The optical sensor 130 may, e.g., comprise a Photonic Mixer Device (PMD) or a Charge-Coupled Device (CCD) for sensing the reflections 121' of the emitted light 121 from the scene. The optical sensor 130 is arranged within the electronic device 100 at the back side of the display device 110. In other words, the display device 110 is arranged between the optical sensor 130 and the scene 190. Accordingly, the reflections 121' of the emitted light 121 from the scene 190 transmit through the display device 110 before reaching the optical sensor 130.

For example, the optical sensor 140 may be a ToF sensor, a sensor of an active stereo camera or any other optical (e.g. infrared) camera. Accordingly, the optical sensor 130 may comprise processing circuitry configured to determine, based on the sensed reflected light from the scene 190, at least one of an image of at least part of the scene 190 or a distance of the electronic device 110 to at least one object (such as the object 191) in the scene 190.

The electronic device 100 further comprises an optical transmitter 140 configured to transmit an optical control signal 141 encoded with control information for controlling the light emission by the illumination element 120 which forms part of the display device 110. The optical transmitter 140 is arranged within the electronic device 100 at the back side of the display device 110. The optical transmitter 140 may, e.g., comprise one or more LEDs or one or more laser diodes (e.g. one or more VCSELs) for generating the optical control signal 141. In general, the optical control signal 141 emitted by the optical transmitter 140 may be of any desired (target) wavelength (wavelength range). For example, the optical control signal 141 may be an infrared signal. The control information is information for controlling the light emission by the illumination element 120. For example, the control information may indicate start and/or stop of the light emission by the illumination element 120, an emission frequency (pulse rate) of light pulses emitted by the illumination element 120, a power of the light/pulses emitted by the illumination element 120, etc. For example, the control information may indicate that the illumination element 120 is to emit light at a frequency of at least 10 Hz. Driving the illumination element 120 at high frequencies of 10 Hz or more may, e.g., be used when a ToF sensor is used as the optical sensor 140 since ToF sensors demand for high frequency illumination.

In addition, the electronic device comprises an optical receiver 150. The optical receiver 150 is for instance integrated into the display device 110. That is, the optical receiver 150 is an integral part of the display device 110. The optical receiver 150 is configured to receive the optical control signal 141. Further, the optical receiver 150 is configured to generate an electrical control signal 151 based on the optical control signal 141. For example, the optical receiver 150 may comprise one or more photodiodes or other optoelectronic conversion circuitry for converting the optical control signal 141 into the electrical control signal 151. In case the optical receiver 150 comprises one or more photodiodes, the light sensitive area(s) of the one or more photodiodes may face the optical transmitter 140. Any kind of material may be provided between the optical transmitter 140 and the optical receiver 150 for guiding the optical control signal 141. For example, an air gap, an optical wave guide, an optical fiber or a combination thereof may be arranged between the optical transmitter 140 and the optical receiver 150 for guiding the optical control signal 141 from the optical transmitter 140 to the optical receiver 150.

A driver circuit 160 is further integrated into the display device 110. That is, the driver circuit 160 is an integral part of the display device 110. The driver circuit 160 is configured to drive the illumination element 120 based on the electrical control signal 151. In other words, the driver circuit 160 controls the light emission by the illumination element 120 in accordance with the control information encoded in the electrical control signal 151. For example, the driver circuit 160 may generate and supply one or more drive signals to the illumination element 120 based on the electrical control signal 151. The driver circuit 160 may, e.g., be formed on a substrate of the display device 110 (e.g. in a thin-film transistor layer of the display device 110). The driver circuit 160 may comprise one or more transistors for switching/driving the illumination element 120 in accordance with the control information encoded to the electrical control signal 151. Accordingly, the illumination element 120 emits the light 121 in accordance with the control information.

Using the proposed optical transmission within the electronic device 100 may allow to supply the control information for the illumination element 120 without the need for extensive additional wiring inside the display device 110. Accordingly, conflicting frequencies, crosstalk and parasitic capacitances may be avoided in the display device 110. Further, including the illumination element 120 in the display device 110 leads to vast energy savings (e.g. 4 times for a 25% transparent display device) compared to under display approaches.

In other words, the present disclosure proposes to control the illumination unit 120 inside the display 110 via an optical connection. Accordingly, the control signal for the illumination unit 120 is transmitted as an optical signal 141 via the optical emitter 140. The optical signal 141 is then received by an optical receiver 150, which is located in the display device 110. The medium in which the light 141 travels between the emitter 140 and receiver 150 can be any material (e.g. an air gap, waveguides, optical fibers, etc.) The optical signal 141 is converted to an electric signal 151. The driving circuit 160 switches the illumination unit 120 according to the electrical signal. The illumination unit 120 emits the light 121 towards the scene 121 in accordance with control signal. The reflected light 121' is received by the optical sensor 130 located behind the (e.g. semi-transparent) display 110.

As indicated in FIG. 1, the optical sensor 130 may be configured to supply the control information to the optical transmitter 140. In other words, the optical sensor 130 may directly drive the optical transmitter 140. Optionally, an amplifier circuit (not illustrated) may be coupled between the optical sensor 130 and the optical transmitter 140. The amplifier circuit is configured to amplify an electrical signal which is supplied from the optical sensor 130 to the optical transmitter 140. The electrical signal provided by the optical sensor 130 is encoded with the control information. The amplifier circuit may be understood as a driver circuit for the optical transmitter 140.

In alternative examples, the optical sensor 130 may supply synchronization information to the optical transmitter 140. In this case, the optical transmitter 140 is configured to generate the control information based on the synchronization information received from the optical sensor 130. In other words, the optical transmitter 140 may alternatively generate the control information encoded to optical control signal 141 itself. Due to the synchronization information, the generation of the control information is synchronized with the optical sensor 130. The synchronization information indicate information related to capture/sensing times of the optical sensor 130 such that the light emission by the illumination unit 120 can be synchronized to the capture/sensing times of the optical sensor 130.

In the example of FIG. 1, the optical sensor 130 is arranged at the back side of the display device. However, it is to be noted that electronic devices according to the proposed technique are not limited thereto. In alternative example, the optical sensor 130 may be arranged at a side of (next to) the display device. In other words, the optical sensor 130 may be arranged between the display device 110 and an edge of the front surface of the electronic device 100 (assuming that the display device 110 does not extend over the entire front surface of the electronic device 100). In further alternative example, the optical sensor 130 may be arranged behind a gap/notch in the display device 110 such that the electronic circuitry of the display device 110 does not impact the optical sensor 130.

According to some examples, the illumination element 120 may comprise a plurality of illumination sub-elements (sub-circuitries, sub-devices) each configured to emit part of the light 121 for illuminating the scene 190. The plurality of illumination sub-elements are distributed over the display device 110 and spaced apart from each other. For example, the illumination sub-elements may be single/individual LEDs, micro LEDs and/or VCSELs that are arranged between the light-emitting elements of the display device. Alternatively, the illumination sub-elements may be groups/clusters of LEDs, micro LEDs and/or VCSELs that are arranged between the light-emitting elements of the display device. In other words, the illumination unit 120 may consist of a manifold of units, which are distributed on the display 110.

The driver circuit 150 may be configured to individually drive the plurality of illumination sub-elements based on the electrical control signal 151. In other words, the plurality of illumination sub-elements may be driven by a central driver circuit 150. Alternatively, the driver circuit 150 may comprise a plurality of driver sub-circuits each configured to drive part of the plurality of illumination sub-elements based on the electrical control signal 151. For example, each of the plurality of illumination sub-elements may have its own driver sub-circuit. Alternatively, at least one of the plurality of illumination sub-elements may drive more than one of the plurality of illumination sub-elements (e.g. a group or a cluster of illumination sub-elements).

For example, the electrical control signal 151 of the optical receiver 140 may be additionally amplified by amplifier circuitry integrated in the display device 110 prior to its distribution to the central driving circuit or the driver sub-circuits.

In order to protect the optical receiver 150 from any background light, an optical filter (not illustrated) may be formed on the optical receiver 150. For example, the optical filter may be formed on the light sensitive area(s) of one or more photodiodes of the optical receiver 150. The optical (e.g. band pass) filter is exclusively transparent for light in a predetermined wavelength range which includes the wavelength of the optical control signal 141. In other words, the optical filter is substantially only transparent for the optical control signal 141.

Additionally or alternatively, the electronic device 100 may comprise a light shield configured to shield the optical receiver 150 from light other than the optical control signal 141. For example, a blocking material may be formed around the optical receiver 150 so as to shield the optical receiver 150 from background light.

Similarly, the electronic device 100 may comprise another light shield configured to shield the optical sensor 130 from the optical control signal 141. For example, a blocking material may be formed around the optical sensor 130 so as to shield the optical sensor 130 from the optical control signal 141. Accordingly, impairment of the optical sensor 130's sensing operation by the optical control signal 141 may be avoided.

Although not illustrated in FIG. 1, the electronic device 100 may optionally comprise further circuitry/elements such as, e.g., one or more microphones, one or more loudspeakers, one or more antennas, one or more application processors, one or more radio frequency transmitters and/or receivers for mobile communication, one or more data storages, one or more batteries, etc.

In order to summarize the processing in the above example, FIG. 2 illustrates a flowchart of an exemplary method 200 for an electronic device. As described above, the electronic device comprises a display device, an illumination element integrated into the display device and an optical sensor. The display device comprises a plurality of light-emitting elements for displaying an optical image on a front side of the display device. The illumination element is for emitting light for illuminating a scene in front of the front side of the display device. The optical sensor is for sensing reflections of the emitted light from the scene.

The method 200 comprises transmitting 202, using an optical transmitter, an optical control signal encoded with control information for controlling light emission by the illumination element. Further, the method 200 comprises receiving 204 the optical control signal at an optical receiver integrated into the display device. The method 200 additionally comprises generating 206, using the optical receiver, an electrical control signal based on the received optical control signal. The method 200 comprises driving 208 the illumination element based on the electrical control signal using a driver circuit integrated into the display device.

The optical transmission of the control information according to the method 200 may allow improved control of the in-display illumination element.

More details and aspects of the method 200 are explained in connection with the proposed technique or the example described above. The method 200 may comprise one or more additional optional features corresponding to one or more aspects of the proposed technique or the example described above.

The examples as described herein may be summarized as follows:

Some examples relate to an electronic device. The electronic device comprises a display device comprising a plurality of light-emitting elements for displaying an optical image on a front side of the display device. Further, the electronic device comprises an illumination element integrated into the display device and configured to emit light for illuminating a scene in front of the front side of the display device. The electronic device additionally comprises an optical sensor configured to sense reflections of the emitted light from the scene, and an optical transmitter configured to transmit an optical control signal encoded with control information for controlling light emission by the illumination element. Furthermore, the electronic device comprises an optical receiver integrated into the display device. The optical receiver is configured to receive the optical control signal and generate an electrical control signal based on the optical control signal. The electronic device comprises a driver circuit integrated into the display device and configured to drive the illumination element based on the electrical control signal.

In some examples, the optical sensor is configured to supply the control information to the optical transmitter.

According to some examples, an amplifier circuit is coupled between the optical sensor and the optical transmitter, wherein the amplifier circuit is configured to amplify an electrical signal which is supplied from the optical sensor to the optical transmitter and encoded with the control information.

In alternative examples, the optical transmitter is configured to generate the control information based on synchronization information supplied from the optical sensor to the optical transmitter.

According to some examples, the illumination element comprises a plurality of illumination sub-elements each configured to emit part of the light for illuminating the scene, wherein the plurality of illumination sub-elements are distributed over the display device and spaced apart from each other, and wherein the driver circuit is configured to individually drive the plurality of illumination sub-elements based on the electrical control signal.

In alternative examples, the illumination element comprises a plurality of illumination sub-elements each configured to emit part of the light for illuminating the scene, wherein the plurality of illumination sub-elements are distributed over the display device and spaced apart from each other, and wherein the driver circuit comprises a plurality of driver sub-circuits each configured to drive part of the plurality of illumination sub-elements based on the electrical control signal.

According to some examples, an optical filter is formed on the optical receiver, wherein the optical filter is exclusively transparent for light in a predetermined wavelength range including a wavelength of the optical control signal.

In some examples, at least one of an air gap, an optical wave guide and an optical fiber are arranged between the optical transmitter and the optical receiver for guiding the optical control signal from the optical transmitter to the optical receiver.

According to some examples, the electronic device further comprises a light shield configured to shield the optical sensor from the optical control signal.

In some examples, the electronic device further comprises a light shield configured to shield the optical receiver from light other than the optical control signal.

According to some examples, the display is arranged between the optical sensor and the scene.

In some examples, the control information indicates that the illumination element is to emit light at a frequency of at least 10 Hz.

According to some examples, the optical sensor is a time-of-flight sensor.

In some examples, the illumination element is configured to emit infrared light for illuminating the scene.

According to some examples, the optical transmitter comprises one or more light-emitting diodes and/or one or more semiconductor lasers for generating the optical control signal.

In some examples, the illumination element comprises one or more light-emitting diodes, one or more micro light-emitting diodes and/or one or more vertical-cavity surface-emitting lasers.

According to some examples, the electronic device is one of a smartphone, a tablet-computer and a laptop-computer.

Other examples relate to a method for an electronic device comprising a display device, an illumination element integrated into the display device and an optical sensor. The display device comprises a plurality of light-emitting elements for displaying an optical image on a front side of the display device. The illumination element is for emitting light for illuminating a scene in front of the front side of the display device. The optical sensor is for sensing reflections of the emitted light from the scene. The method comprises transmitting, using an optical transmitter, an optical control signal encoded with control information for controlling light emission by the illumination element. Further, the method comprises receiving the optical control signal at an optical receiver integrated into the display device. The method additionally comprises generating, using the optical receiver, an electrical control signal based on the received optical control signal. The method comprises driving the illumination element based on the electrical control signal using a driver circuit integrated into the display device.

Examples of the present disclosure may enable an optical connection between under-display optical sensors and in-display illumination units. According to examples of the present disclosure, an optical signal may be used to connect an optical sensor (located behind an, e.g., smartphone display) with an illumination unit (located in an, e.g., smartphone display).

The aspects and features described in relation to a particular one of the previous examples may also be combined with one or more of the further examples to replace an identical or similar feature of that further example or to additionally introduce the features into the further example.

It is further understood that the disclosure of several steps, processes, operations or functions disclosed in the description or claims shall not be construed to imply that these operations are necessarily dependent on the order described, unless explicitly stated in the individual case or necessary for technical reasons. Therefore, the previous description does not limit the execution of several steps or functions to a certain order. Furthermore, in further examples, a single step, function, process or operation may include and/or be broken up into several sub-steps, -functions, -processes or -operations.

If some aspects have been described in relation to a device or system, these aspects should also be understood as a description of the corresponding method. For example, a block, device or functional aspect of the device or system may correspond to a feature, such as a method step, of the corresponding method. Accordingly, aspects described in relation to a method shall also be understood as a description of a corresponding block, a corresponding element, a property or a functional feature of a corresponding device or a corresponding system.

The following claims are hereby incorporated in the detailed description, wherein each claim may stand on its own as a separate example. It should also be noted that although in the claims a dependent claim refers to a particular combination with one or more other claims, other examples may also include a combination of the dependent claim with the subject matter of any other dependent or independent claim. Such combinations are hereby explicitly proposed, unless it is stated in the individual case that a particular combination is not intended. Furthermore, features of a claim should also be included for any other independent claim, even if that claim is not directly defined as dependent on that other independent claim.

What is claimed is:

1. An electronic device, comprising:
   a display device comprising a plurality of light-emitting elements configured to display an optical image on a front side of the display device;
   an illumination element integrated into the display device and configured to emit light for illuminating a scene in front of the front side of the display device;
   an optical sensor configured to sense reflections of the emitted light from the scene;
   an optical transmitter configured to transmit an optical control signal encoded with control information for controlling light emission by the illumination element;
   an optical receiver integrated into the display device, wherein the optical receiver is configured to receive the optical control signal and generate an electrical control signal based on the optical control signal; and
   a driver circuit integrated into the display device and configured to drive the illumination element based on the electrical control signal.

2. The electronic device of claim 1, wherein the optical sensor is configured to supply the control information to the optical transmitter.

3. The electronic device of claim 2, further comprising:
   an amplifier circuit coupled between the optical sensor and the optical transmitter,
   wherein the amplifier circuit is configured to amplify an electrical signal which is supplied from the optical sensor to the optical transmitter and encoded with the control information.

4. The electronic device of claim 1, wherein the optical transmitter is configured to generate the control information based on synchronization information supplied from the optical sensor to the optical transmitter.

5. The electronic device of claim 1, wherein the illumination element comprises a plurality of illumination sub-elements each configured to emit part of the light for illuminating the scene, wherein the illumination sub-elements are distributed over the display device and spaced apart from each other, and wherein the driver circuit is configured to individually drive the illumination sub-elements based on the electrical control signal.

6. The electronic device of claim 1, wherein the illumination element comprises a plurality of illumination sub-elements each configured to emit part of the light for illuminating the scene, wherein the illumination sub-elements are distributed over the display device and spaced apart from each other, and wherein the driver circuit comprises a plurality of driver sub-circuits each configured to drive part of the plurality of illumination sub-elements based on the electrical control signal.

7. The electronic device of claim 1, wherein an optical filter is formed on the optical receiver, wherein the optical filter is exclusively transparent for light in a predetermined wavelength range including a wavelength of the optical control signal.

8. The electronic device of claim 1, further comprising:
   at least one of an air gap, an optical wave guide and an optical fiber arranged between the optical transmitter and the optical receiver and configured to guide the optical control signal from the optical transmitter to the optical receiver.

9. The electronic device of claim 1, further comprising a light shield configured to shield the optical sensor from the optical control signal.

10. The electronic device of claim 1, further comprising a light shield configured to shield the optical receiver from light other than the optical control signal.

11. The electronic device of claim 1, wherein the display is arranged between the optical sensor and the scene.

12. The electronic device of claim 1, wherein the optical sensor is a time-of-flight sensor.

13. The electronic device of claim 1, wherein the illumination element is configured to emit infrared light for illuminating the scene.

14. The electronic device of claim 1, wherein the illumination element comprises one or more light-emitting diodes, one or more micro light-emitting diodes and/or one or more vertical-cavity surface-emitting lasers.

15. A method for an electronic device comprising a display device, an illumination element integrated into the display device and an optical sensor, wherein the display device comprises a plurality of light-emitting elements for displaying an optical image on a front side of the display device, wherein the illumination element is for emitting light for illuminating a scene in front of the front side of the display device, and wherein the optical sensor is for sensing reflections of the emitted light from the scene, the method comprising:
   transmitting, using an optical transmitter, an optical control signal encoded with control information for controlling light emission by the illumination element;
   receiving the optical control signal at an optical receiver integrated into the display device;
   generating, using the optical receiver, an electrical control signal based on the received optical control signal; and driving the illumination element based on the electrical control signal using a driver circuit integrated into the display device.

\* \* \* \* \*